US007696956B2

(12) United States Patent
Deng et al.

(10) Patent No.: US 7,696,956 B2
(45) Date of Patent: Apr. 13, 2010

(54) APPARATUS FOR VIDEO GRAPHICS ARRAY TESTING

(75) Inventors: Xue-feng Deng, Shenzhen (CN); Hao-yu Guo, Shenzhen (CN); Huang-nien Lin, Tu-Cheng (TW); Tai-chen Wang, Tu-Cheng (TW)

(73) Assignees: Hong Fu Jin Precision Indsutry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 846 days.

(21) Appl. No.: 11/309,418

(22) Filed: Aug. 4, 2006

(65) Prior Publication Data

US 2007/0109307 A1 May 17, 2007

(30) Foreign Application Priority Data

Nov. 11, 2005 (CN) ........................ 2005 1 0101235

(51) Int. Cl.
*G09G 1/06* (2006.01)
*G01R 31/28* (2006.01)
*H04N 17/00* (2006.01)

(52) U.S. Cl. ....................... 345/10; 324/158.1; 348/180

(58) Field of Classification Search ................. 345/204, 345/10; 702/108–126; 73/596, 602; 348/180–194; 324/158.1, 500, 754, 761, 763–765
See application file for complete search history.

(56) References Cited

U.S. PATENT DOCUMENTS 5,345,263 A * 9/1994 Miller ........................ 348/182
5,808,464 A * 9/1998 Natori et al. ............ 324/121 R
5,929,628 A * 7/1999 Becker et al. ............ 324/158.1
6,323,828 B1 * 11/2001 Perez .......................... 345/10

FOREIGN PATENT DOCUMENTS

CN 2594869 Y 12/2003
TW I238962 5/2004

* cited by examiner

*Primary Examiner*—Bipin Shalwala
*Assistant Examiner*—Keith Crawley
(74) *Attorney, Agent, or Firm*—Wei Te Chung

(57) ABSTRACT

An apparatus for video graphics array (VGA) testing includes a connector, a switch, and an output. The connector has at least one signal output pin. The signal output pin of the VGA connector is connected to the output via the switch. The output can be coupled with an oscilloscope or other similar signal analyzing device. It is simple and efficient to use the apparatus for coupling a VGA connector of a computer with an oscilloscope in the VGA testing process.

1 Claim, 1 Drawing Sheet

APPARATUS FOR VIDEO GRAPHICS ARRAY TESTING

FIELD OF THE INVENTION

The present invention relates to an apparatus for video graphics array (VGA) testing.

DESCRIPTION OF RELATED ART

Generally, personal computers all use the same type of 15 pin display connector. Because that connector was used in the original IBM Video Graphics Array (VGA) card, it is often referred to simply as the VGA connector. Since the VGA connector is so widely used it acts as a standard that enables different graphic display electronics providers to provide equipment that mate with displays from different display providers.

VGA connectors are widely used among all kinds of video adapters. A generic VGA connector has fifteen pins, twelve of which serve pre-determined functions. For example, the first pin is for transferring red color signals, the third pin is for transferring blue color signals, and the fourteenth pin is for transferring vertical sync signals.

VGA testing is performed to test the quality of VGA signals transmitted by a VGA connector. Performance quality of a VGA card can be ascertained by testing the video information signals transferred by the VGA connector. Conventionally, analysis of the signals is usually done with an oscilloscope. Probes of the oscilloscope are manually touched to each pin of the VGA connector and signal from the pin is then analyzed. It is inconvenient and time consuming to connect with each pin in this way.

What is needed is an apparatus for coupling the VGA connector of a computer with a VGA testing device such as an oscilloscope.

SUMMARY OF THE INVENTION

An exemplary apparatus for video graphics array (VGA) testing includes a connector, a switch, and an output. The connector has at least one signal output pin. The signal output pin of the VGA connector is connected to the output via the switch. The output can be coupled with an oscilloscope or other similar device suitable for signal analysis.

Other advantages and novel features will become more apparent from the following detailed description when taken in conjunction with the accompanying drawings, in which:

DETAILED DESCRIPTION OF THE INVENTION

Figure 1:
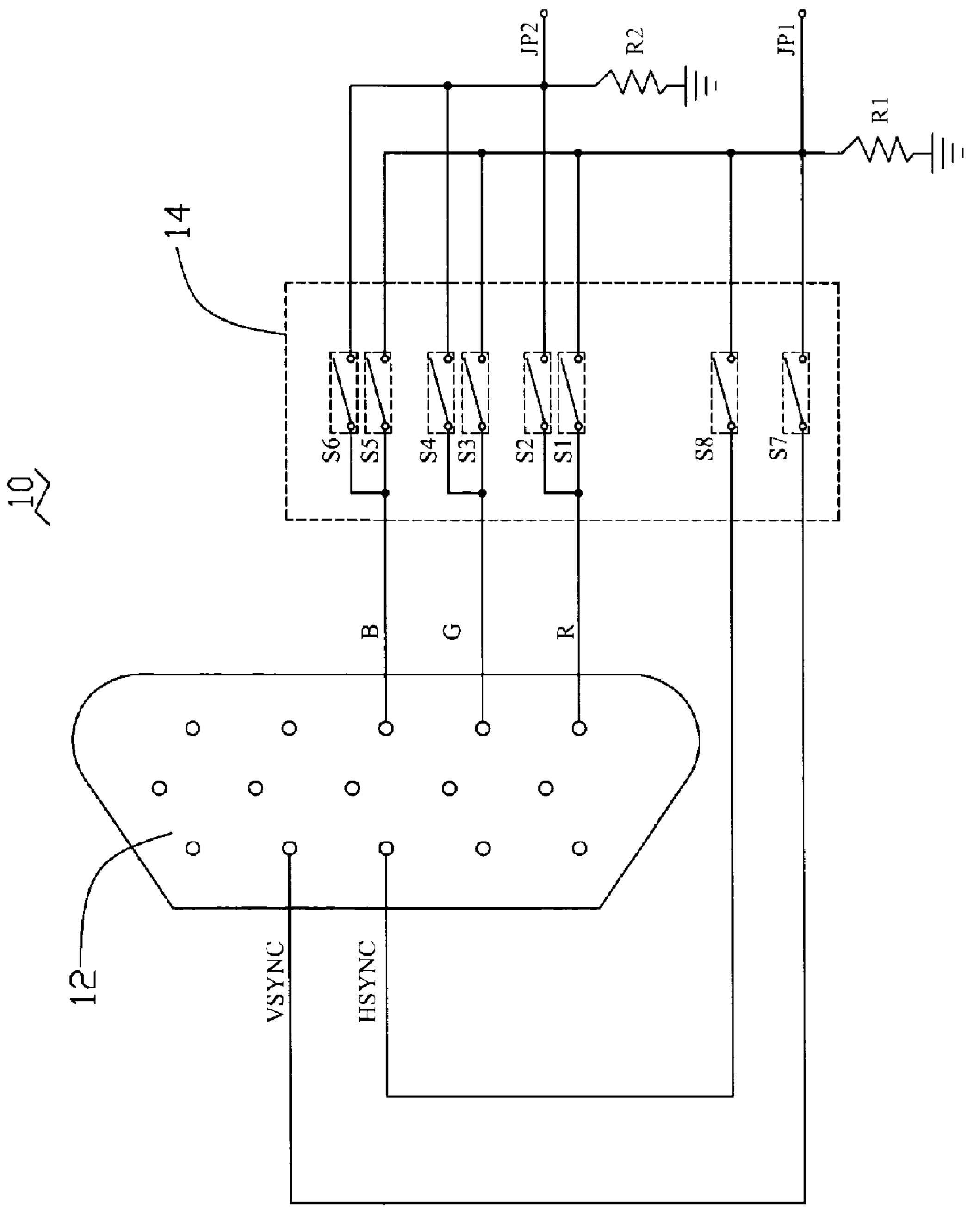
FIG. 1 is a schematic diagram of one embodiment of an apparatus for testing a VGA connector in accordance with a preferred embodiment of the present invention.

Referring to FIG. 1, an apparatus 10 includes a VGA connector 12, a switch circuit 14, a first output JP1, and a second output JP2. The VGA connector 12 includes a plurality of signal output pins such as a red signal pin R, a green signal pin G, a blue signal pin B, a vertical sync signal pin VSYNC, and a horizontal sync signal pin HSYNC. The switch circuit includes a plurality of switches S1~S8.

The red signal pin R is coupled with the first output JP1 and the second output JP2 via the switches S1 and S2 respectively. The green signal pin G is coupled with the first output JP1 and the second output JP2 via the switches S3 and S4 respectively. The blue signal pin B is coupled with the first output JP1 and the second output JP2 via the switches S5 and S6 respectively. The vertical sync signal pin VSYNC is coupled with the first output JP1 via the switch S7. The horizontal sync signal pin HSYNC is coupled with the first output JP1 via the switch S8.

In VGA testing process, the VGA connector 12 is coupled with a computer while the first and second outputs JP1 and JP2 are correspondingly coupled with first and second inputs of an oscilloscope, or other similar device used in the analysis of signals, respectively. The apparatus 10 can selectively transmit signals from the VGA connector 12 to the oscilloscope via the switch circuit 14. The quality of the VGA signals can be ascertained by analysis with the oscilloscope.

It is to be understood, however, that even though numerous characteristics and advantages of the present embodiments have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An apparatus for video graphics array (VGA) testing, comprising:

a VGA connector with a plurality of signal output pins;

a first output and a second output to output a plurality of VGA signals from the plurality of signal output pins;

a plurality of switches coupling the signal output pins of the VGA connector with the first output and the second output to selectively output the plurality of VGA signals; and a signal analyzing device to be coupled with the first output and the second output to receive and analyze the selected VGA signals, to ascertain quality of the selected VGA signals;

wherein the output signal pins comprise a red signal pin, a green signal pin, a blue signal pin, a vertical sync signal pin, and a horizontal sync signal pin; and wherein the plurality of switches comprise first to eighth switches, the red signal pin is coupled with the first output via the first switch and coupled with the second output via the second switch, the green signal pin is coupled with the first output via the third switch and coupled with the second output via the fourth switch, the blue signal pin is coupled with the first output via the fifth switch and coupled with the second output via the sixth switch, the vertical sync signal pin is coupled with the first output via the seventh switch, the horizontal sync signal pin is coupled with the first output via the eighth switch.

* * * * *